United States Patent
Okuyama et al.

(10) Patent No.: US 9,106,005 B2
(45) Date of Patent: Aug. 11, 2015

(54) SURFACE MOUNT DEVICE

(75) Inventors: Takeshi Okuyama, Tokyo (JP);
Toshihiro Kusagaya, Tokyo (JP); Tohru Yamakami, Tokyo (JP)

(73) Assignee: FUJITSU COMPONENT LIMITED, Tokyo (JP)

( * ) Notice: Subject to any disclaimer, the term of this patent is extended or adjusted under 35 U.S.C. 154(b) by 169 days.

(21) Appl. No.: 13/356,791

(22) Filed: Jan. 24, 2012

(65) Prior Publication Data
US 2012/0193139 A1 Aug. 2, 2012

(30) Foreign Application Priority Data
Jan. 31, 2011 (JP) ................. 2011-018488

(51) Int. Cl.
| | |
|---|---|
| H01L 23/48 | (2006.01) |
| H01R 12/57 | (2011.01) |
| H01R 4/02 | (2006.01) |
| H05K 3/34 | (2006.01) |
| H01R 12/72 | (2011.01) |
| H01R 13/6587 | (2011.01) |
| H05K 1/02 | (2006.01) |

(52) U.S. Cl.
CPC ............. *H01R 12/57* (2013.01); *H01R 4/028* (2013.01); *H05K 3/3426* (2013.01); *H01R 12/724* (2013.01); *H01R 13/6587* (2013.01); *H05K 1/025* (2013.01); *H05K 2201/10189* (2013.01); *H05K 2201/10757* (2013.01); *H05K 2201/10803* (2013.01); *H05K 2201/10909* (2013.01); *H05K 2201/2081* (2013.01)

(58) Field of Classification Search
CPC ................... H01R 4/028; H05K 2101/10757; H05K 2101/10803
USPC .............. 257/667, 692; 439/83; 174/551, 552
See application file for complete search history.

(56) References Cited

U.S. PATENT DOCUMENTS

| | | | |
|---|---|---|---|
| 4,722,470 A | | 2/1988 | Johary |
| 6,300,678 B1 * | | 10/2001 | Suehiro et al. ............... 257/697 |
| 6,421,912 B1 | | 7/2002 | Tomioka et al. |
| 6,641,410 B2 * | | 11/2003 | Marvin et al. ................. 439/83 |
| 6,986,682 B1 | | 1/2006 | Jeon |
| 2005/0000727 A1 * | | 1/2005 | Wallace ....................... 174/260 |
| 2005/0064745 A1 * | | 3/2005 | Zhang ............................ 439/83 |
| 2005/0142907 A1 * | | 6/2005 | Myer et al. ..................... 439/79 |
| 2006/0246753 A1 * | | 11/2006 | Ishikawa ......................... 439/79 |
| 2008/0041923 A1 * | | 2/2008 | Kato et al. ................... 228/191 |
| 2008/0179076 A1 * | | 7/2008 | Ju ............................... 174/126.2 |
| 2008/0266828 A1 * | | 10/2008 | Xu et al. ...................... 361/813 |

FOREIGN PATENT DOCUMENTS

| | | |
|---|---|---|
| EP | 2048924 | 4/2009 |
| JP | S63-143894 | 6/1988 |
| JP | 2001-035577 | 2/2001 |
| JP | 2004-319249 | 11/2004 |

* cited by examiner

*Primary Examiner* — Hung V Ngo
(74) *Attorney, Agent, or Firm* — IPUSA, PLLC

(57) ABSTRACT

Disclosed is a surface mount device to be mounted on a base member, including plural lead units, each of the plural lead units including, a lead including a body portion and a foot formed at an end of the lead; a solder portion formed at the foot of the lead to protrude toward the direction of the base member to have a summit portion, and a diffusion prevention portion provided on the lead for preventing a diffusion of a solder along the body portion of the lead.

8 Claims, 16 Drawing Sheets

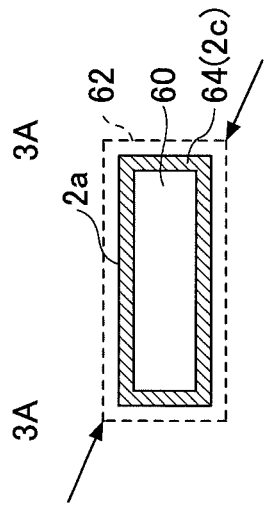
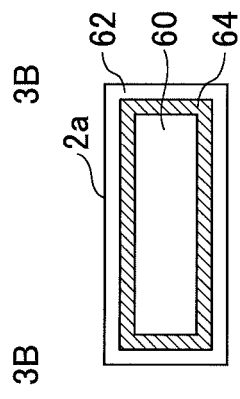
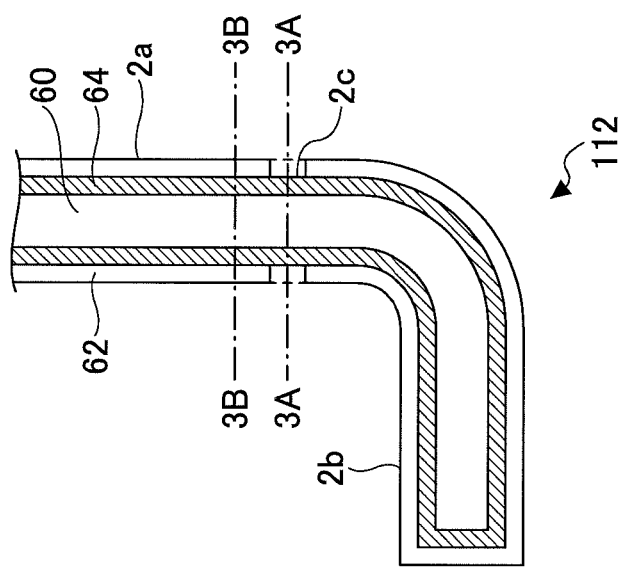

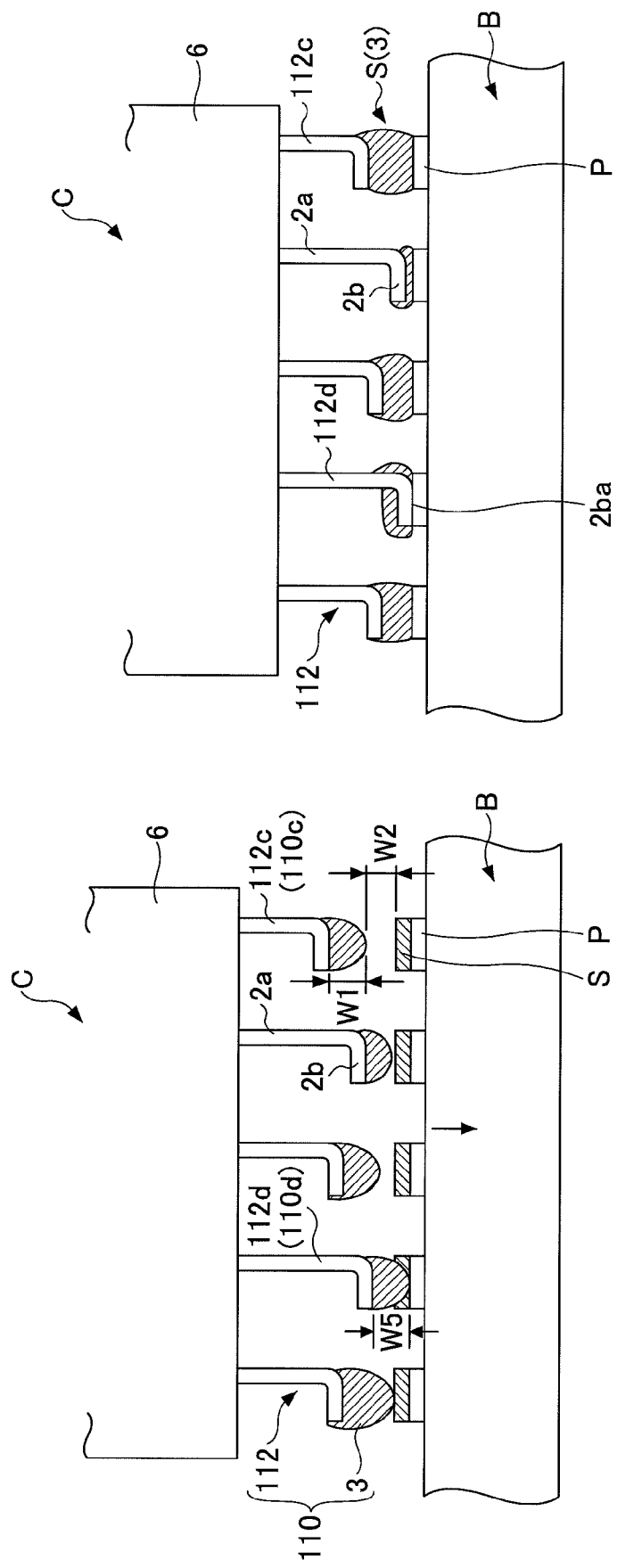

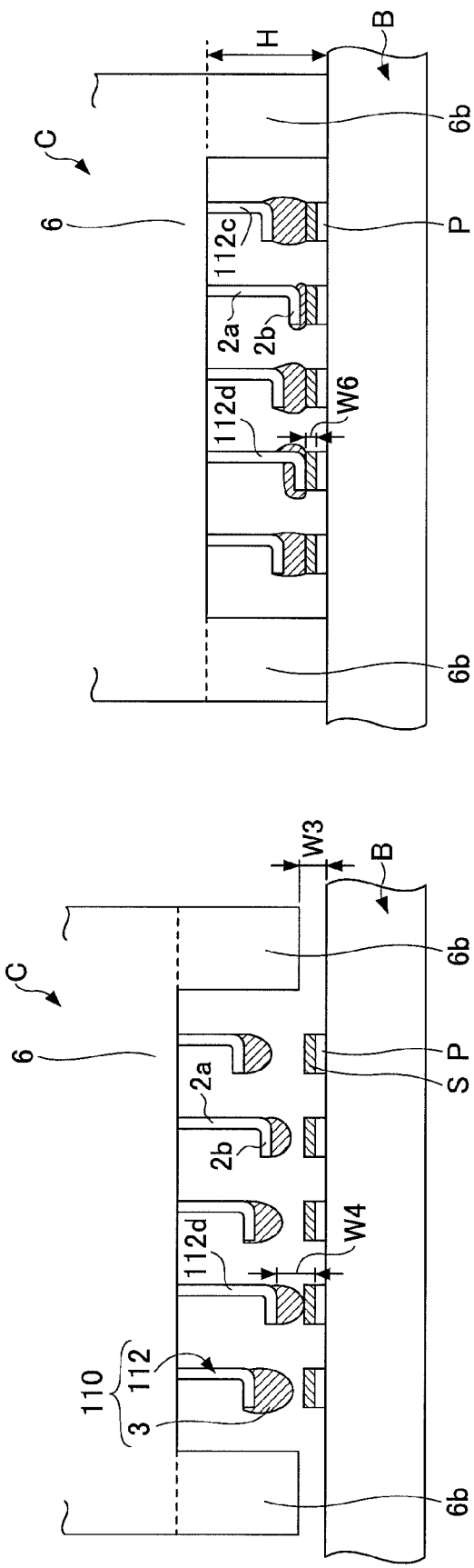

SURFACE MOUNT DEVICE

BACKGROUND OF THE INVENTION

1. Field of the Invention

The present invention relates to a surface mount device which is to be mounted on a base member such as a board and method of manufacturing the surface mount device and more specifically, to a surface mount device including plural leads to be connected to pads or the like of a base member such as a board by solder and a method of manufacturing the surface mount device.

2. Description of the Related Art

For a surface mount device (SMD), including plural leads, to be mounted by a surface mount technology (SMT), the leads are generally formed into L shape, J shape, butt shape, Ball Grid Array (BGA) or the like. U.S. Pat. No. 6,986,682 discloses a high speed connector assembly including surface mount connectors. In such a device, a flexible printed circuit (FPC) portion is attached to a printed circuit board using solder balls.

However, when heating the structure for mounting the connector to the printed circuit board as described in U.S. Pat. No. 6,986,682, the board easily warps so that the distance between the board and each of the leads becomes different and a problem occurs where there is disconnection of the leads to the board occurs.

SUMMARY OF THE INVENTION

The present invention is made in light of the above problems, and provides a surface mount device and a method of manufacturing the surface mount device which can form a good connection with a base member such as a board or the like even when the base member warps or there is a variation in the length of the leads.

The present invention has been made based on the knowledge the inventors have obtained and has the following configurations.

According to an embodiment, there is provided a surface mount device to be mounted on a base member, including plural lead units, each of the plural lead units including, a lead including a body portion and a foot formed at an end of the lead; a solder portion formed at the foot of the lead to protrude toward the direction of the base member to have a summit portion, and a diffusion prevention portion provided on the lead for preventing a diffusion of a solder along the body portion of the lead.

According to another embodiment, there is provided a method of manufacturing a surface mount device to be mounted on a base member including plural lead units each including a lead composed of a body portion and a foot formed at an end of the lead and a diffusion prevention portion for preventing a diffusion of a solder provided on the lead, including, introducing solder into plural concave portions provided in a pallet and aligned to correspond to the leads of the plural lead units; contacting or inserting each of the leads in the solder introduced in the respective concave portion while the solder is melted by heating to form a solder portion at the foot of the lead to protrude toward the direction of the base member to have a summit portion.

BRIEF DESCRIPTION OF THE DRAWINGS

Other objects, features and advantages of the present invention will become more apparent from the following detailed description when read in conjunction with the accompanying drawings.

FIG. 3A is a cross-sectional view of the lead of an embodiment;

FIG. 3B is a cross-sectional view taken along a 3B-3B line shown in FIG. 3A;

FIG. 3C is a cross-sectional view taken along a 3A-3A line shown in FIG. 3A;

FIG. 14A is a cross-sectional view showing an example of the connector C and a board B;

FIG. 14B is a cross-sectional view showing the example of the connector C and the board B;

FIG. 15A is a cross-sectional view showing another example of the connector C and the board B; and FIG. 15B is a cross-sectional view showing another example of the connector C and the board B.

DETAILED DESCRIPTION OF THE PREFERRED EMBODIMENTS

Figure 1A:
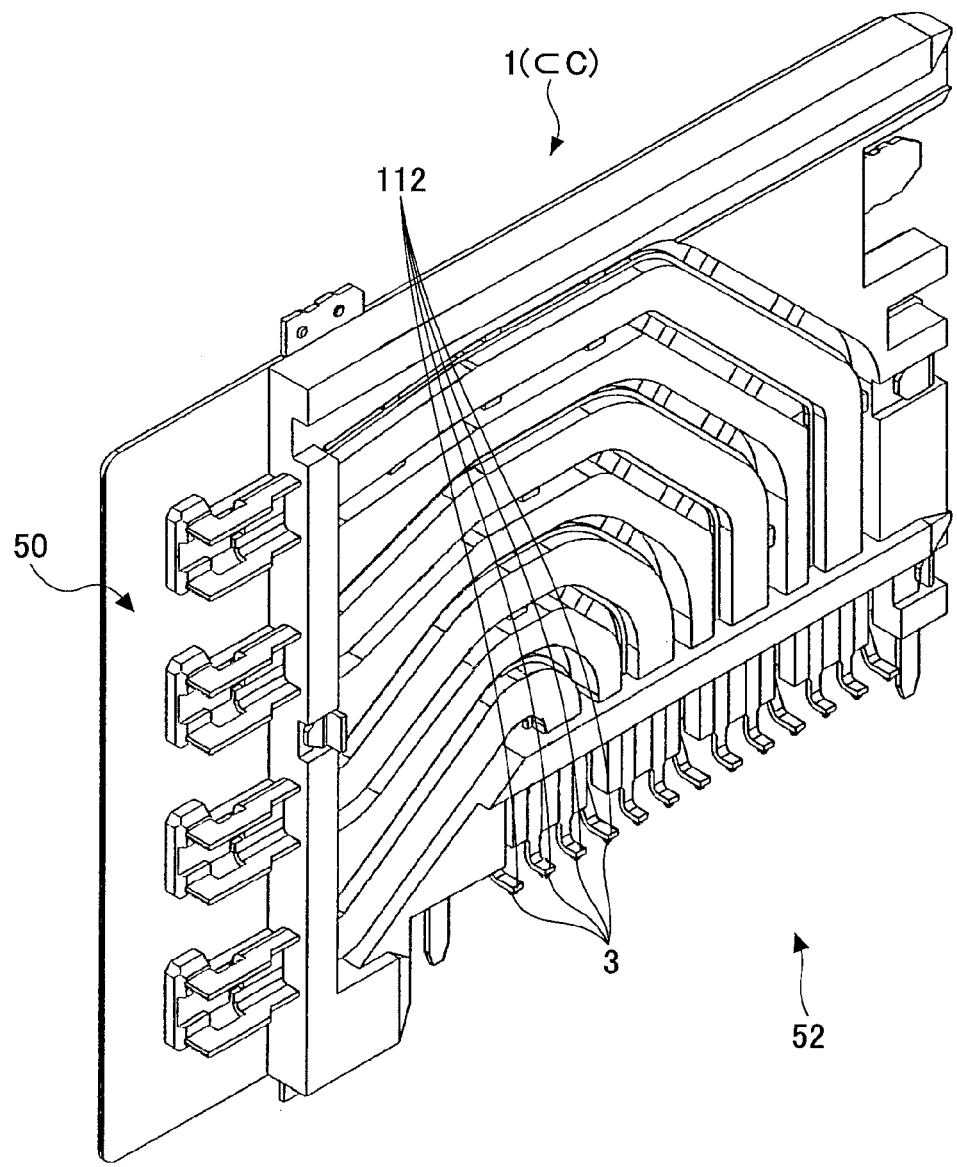
FIG. 1A is a perspective view showing an example of a connector module included in a connector C of an embodiment.

The invention will be described herein with reference to illustrative embodiments. Those skilled in the art will recognize that many alternative embodiments can be accomplished using the teachings of the present invention and that the invention is not limited to the embodiments illustrated for explanatory purposes.

Next, embodiments of the present invention will be described below with reference to drawings.

It is to be noted that, in the explanation of the drawings, the same components are given the same reference numerals, and explanations are not repeated.

Figure 11:
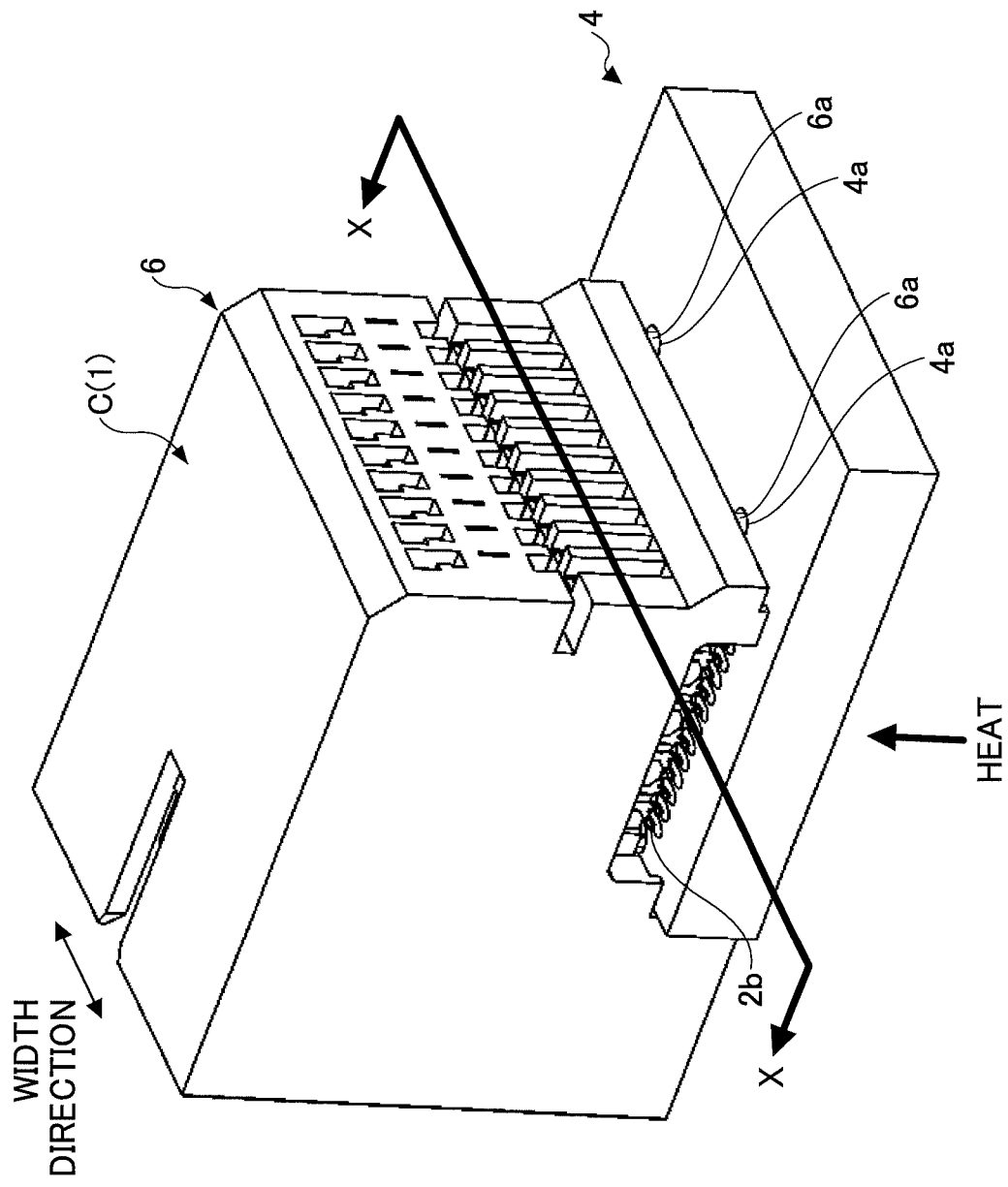
FIG. 11 is a perspective view showing an example of the connector C of an embodiment.

FIG. 11 is a perspective view showing an example of a connector C of an embodiment. The connector C includes a housing 6 and plural connector modules 1 fixed in the housing 6 and aligned along a width direction. The structure of the connector C will be explained later.

Figure 1B:
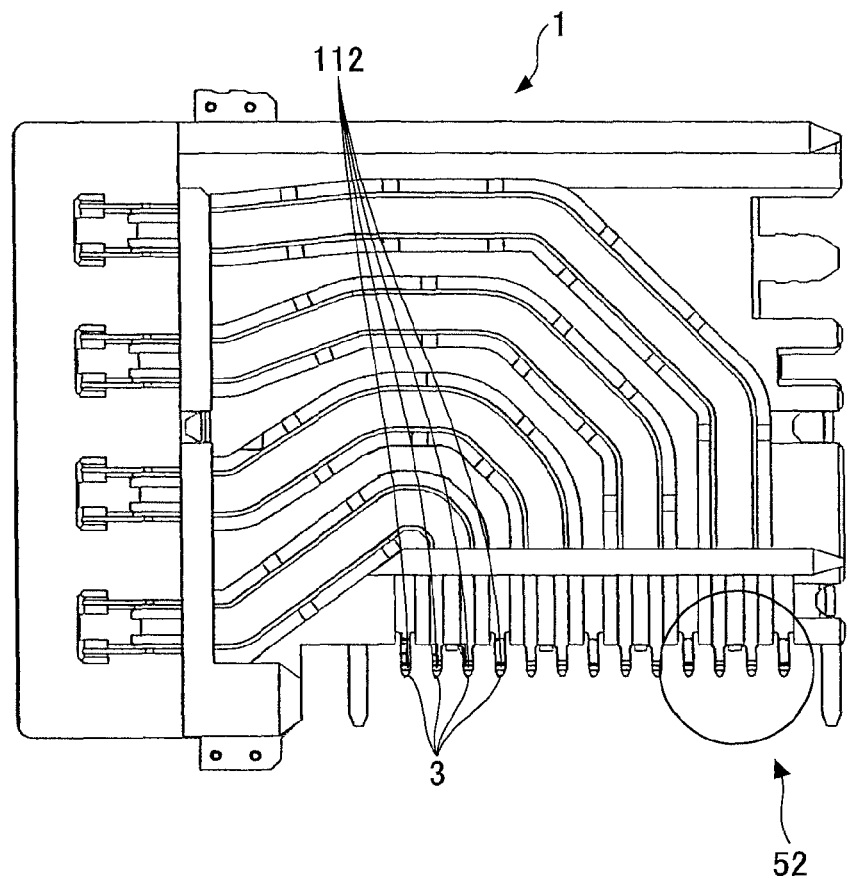
FIG. 1B is a plan view showing the connector module shown in FIG. 1A.
Figure 1C:
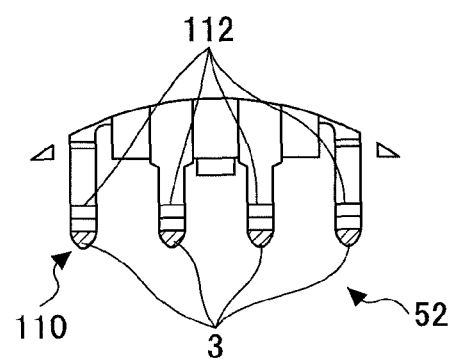
FIG. 1C is an enlarged plan view showing a part of the connector module shown in FIG. 1B.

FIG. 1A is a perspective view showing an example of the connector module 1 included in the connector C of the embodiment. FIG. 1B is a plan view showing the connector module 1 shown in FIG. 1A. FIG. 1C is an enlarged plan view showing a part of the connector module 1 shown in FIG. 1B.

The connector module 1 has almost a rectangular shape. The connector module 1 includes a connecting part 50 positioned at the left shorter edge of the connector module 1 and a mounting part 52 positioned at the lower longer edge of the connector module 1, in FIG. 1B.

The mounting part 52 includes plural lead units 110 which are aligned along the lower longer edge of the connector module 1. The lead unit 110 is composed of a lead 112 and a solder portion 3 provided at a first end of the lead 2. The leads 112 are exposed at the lower longer edge of the connector module 1 and are electrically connected to pads (or lands) of a base member such as a board (not shown in FIG. 1A to FIG. 1C). Referring to FIG. 11 as well, the first ends of the leads 112 are aligned in a matrix at a mounting surface which is to be facing the base member (not shown in FIG. 1A to FIG. 1C).

The connecting part 50 includes contacts, composed of second ends which are other than the first ends of the leads 112, used for connecting to an opposing connector not shown in the drawings. Alternatively, the connecting part 50 may include contacts for connecting to an opposing connector via a solder or via another base member such as a print board.

The middle part of each of the leads 112 between the first end and the second end is bent to have a reverse shape of U as shown in FIG. 1B and is embedded in an insulator composed of a plastic or the like composing the body of the connector module 1. The insulator includes a slit that also has a reverse of U and that exposes parts of the middle part of each of the leads 112 to adjust for an impedance of the lead 112.

The connector C includes plural groups of leads each including two leads 112 for sending a signal composing a balanced transmission line and one lead 112 for a ground line, for example.

Figure 2:
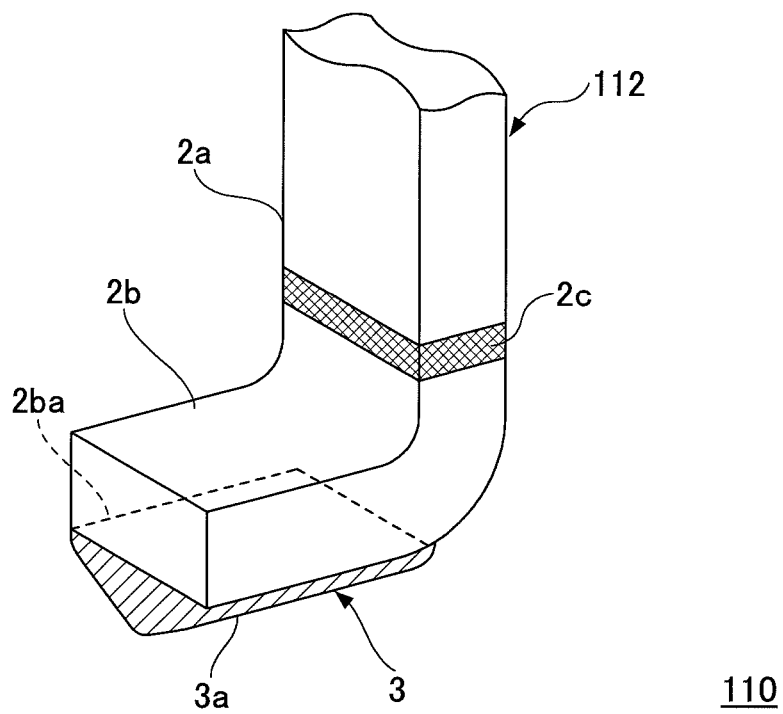
FIG. 2 is a perspective view showing a first end of the lead shown in FIG. 1C.

FIG. 2 is a perspective view showing the first end of the leads 112 shown in FIG. 1C.

The lead 112 of the embodiment includes a body portion 2a which has a long plate shape extending in a vertical direction in FIG. 2 and a foot 2b which is formed at the end of the lead 112 by bending the lead 112 at the end of the body portion 2a. For the example shown in FIG. 2, the foot 2b is substantially perpendicular to the body portion 2a. In this embodiment, the foot 2b has a connecting surface 2ba which is to face a pad of the base member and to be electrically connected to the pad when the connector C is mounted on the base member.

The solder portion 3 is mainly formed at the foot 2b of the lead 112. The solder portion 3 is attached to the connecting surface 2ba of the lead 112 to protrude toward the direction of the base member (lower direction in FIG. 2) to have a summit portion 3a. The solder portion 3 is formed by attaching soldering paste in a melted condition. The method of forming the solder portion 3 will be explained later.

Further, the lead unit 110 includes a diffusion prevention portion provided on the lead 112 for preventing a diffusion of solder along the body portion 2a (upper direction in FIG. 2) of the lead 112. In this embodiment, the diffusion prevention portion may be a solder dam 2c, whose wettability is lower than the other part of the lead 112, formed at the body portion 2a near the foot 2b of the lead 112.

FIG. 3A is a cross-sectional view of the lead 112 of the embodiment.

As shown in FIG. 3A, the lead 112 of the embodiment is composed of a conductive portion 60 formed at the center, a surface layer 62 formed at the surface, and a base layer 64 formed between the conductive portion 60 and the surface layer 62. The conductive portion 60 may be composed of a material including copper, for example. The surface layer 62 may be composed of a material capable of increasing wettability such as a gold plating material including but not limited to gold, for example. The base layer may be composed of a material including Ni such as a nickel sulfamate hydrate, a modified Watts nickel, or the like, for example. In this embodiment, the wettability of the base layer 64 is lower than the wettability of the surface layer 62. Therefore, the solder dam 2c may be formed by removing the surface layer 62 to expose the base layer 64.

The surface layer 62 composed of a gold plating may be removed by irradiation of laser lights. FIG. 3B is a cross-sectional view taken along a 3B-3B line shown in FIG. 3A. FIG. 3C is a cross-sectional view taken along a 3A-3A line shown in FIG. 3A.

As shown by arrows in FIG. 3C, laser lights may be irradiated from two directions on a diagonal line. The width of the laser light may be 50 μm, for example, and the width of the solder dam 2c in the extended direction of the lead 112 (in the vertical direction in FIG. 3A) may be about 0.1 mm, for example. As a result, as shown by a dotted line in FIG. 3C, the surface layer 62 is removed to expose the base layer 64 that functions as the solder dam 2c.

Alternatively, a material which is the same as that composing the base layer 64 may be formed on the surface layer 62 to form the solder dam 2c by plating, sputtering, spraying or the like.

It means that the lead unit 110 of the embodiment includes the solder dam 2c as the diffusion prevention portion that decreases wettability. Here, the wettability means the adhesion characteristics of spreading a heated and melted soldering paste over a surface of an object such as the lead 112 or the like. When the wettability is high, the heated and melted soldering paste easily spreads over the surface of the object.

Further, as shown in FIG. 2 and in FIG. 3C, the solder dam 2c is cylindrically formed in the horizontal direction or lateral direction to separate the body portion 2a of the lead 112 in its extended direction (in the vertical direction). The solder dam 2c is cylindrically formed to cross the extended direction of the body portion 2a of the lead 112 so that the whole of the body portion 2a of the lead 112 can be blocked by the solder dam 2c when the lead 112 is inserted into the soldering paste or the like. With this structure, the solder can be blocked by the solder dam 2c and cannot spread upward from the solder dam 2c. However, provided that the solder can be blocked, the solder dam 2c is not necessarily formed in a continuous cylindrical form, for example.

Figure 4A:
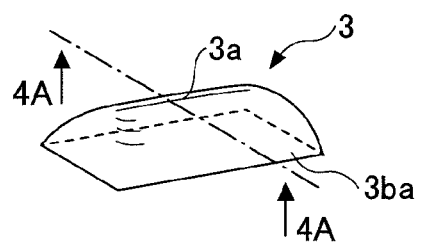
FIG. 4A is a perspective view showing an example of the solder portion.
Figure 4B:
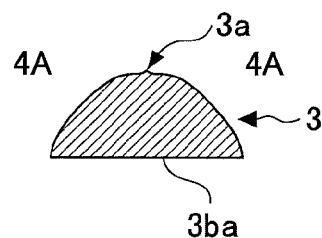
FIG. 4B is a cross-sectional view of the solder portion taken along a 4A-4A line shown in FIG. 4A.
Figure 4C:
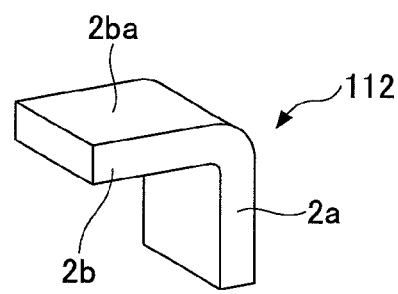
FIG. 4C is a perspective view showing an example of the lead.
Figure 4D:
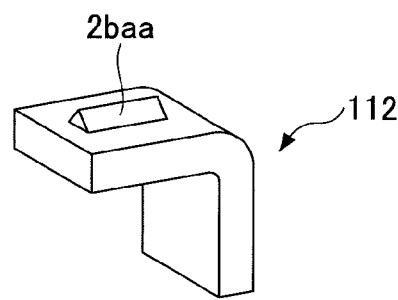
FIG. 4D is a perspective view showing another example of the lead.

FIG. 4A is a perspective view showing an example of the solder portion 3. FIG. 4B is a cross-sectional view of the solder portion 3 taken along a 4A-4A line shown in FIG. 4A. FIG. 4C is a perspective view showing an example of the lead 112 where the position of the lead is opposite of that shown in FIG. 2.

The solder portion 3 is composed of soldering paste of a predetermined amount formed on the connecting surface 2ba of the lead 112. The solder portion 3 of the embodiment is formed to include a connecting surface 3ba that contacts the connecting surface 2ba of the lead 112. The solder portion 3 is formed to protrude toward the opposite direction from the connecting surface 3ba to have a summit portion 3a. The summit portion 3a is formed to compose an edge line. As shown in FIG. 4B, the solder portion 3 has almost a semicircular shape in the cross-sectional view.

The connecting surface 2ba of the lead 112 may have a flat surface as shown in FIG. 4B. Alternatively, the lead 112 may include a protruding portion 2baa formed at the connecting surface 2ba. The protruding portion 2baa may be formed to correspond to the edge line of the summit portion 3a of the solder portion 3. By forming the protruding portion 2baa, the position of the summit portion 3a of the solder portion 3 can be precisely set.

A method of forming the solder portion 3 of the connector C of the embodiment is explained.

Figure 10:
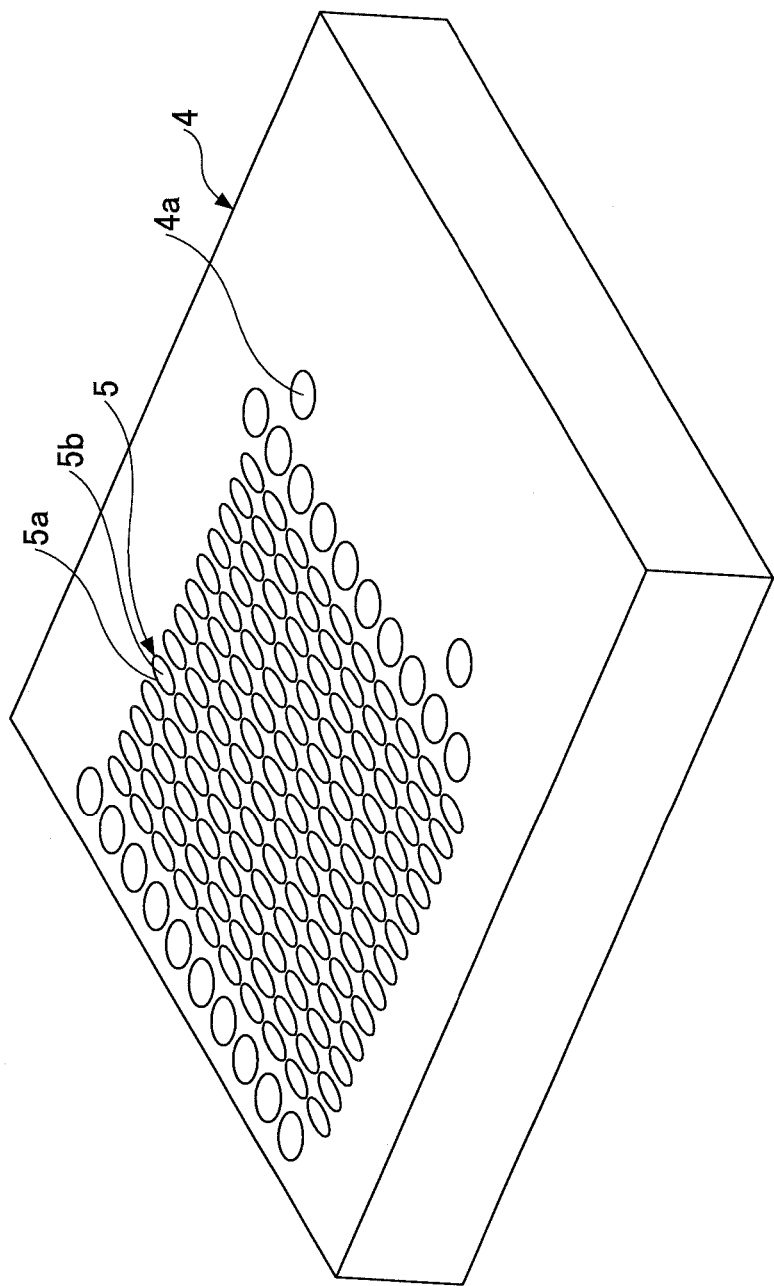
FIG. 10 is a perspective view showing an example of the pallet.

As shown in FIG. 11, the solder portions 3 are formed using a pallet 4. FIG. 10 is a perspective view showing an example of the pallet 4. As described above, the first ends of the leads 112 of the connector C are aligned in a matrix at the mounting surface which is to be facing the board. The pallet 4 includes plural concave portions 5 formed to align in a matrix in accordance with the alignment of the first ends of the leads 112 at the mounting surface.

Each of the concave portions 5 is formed to have an opening 5a with a size large enough to receive the foot 2b of the lead 112 and a bottom portion 5b. The opening 5a may have an elliptical shape in a plan view. The longer axis of the elliptical shape may be set in accordance with the length of the foot 2b of the lead 112. The bottom portion 5b may have a concave shape such that it is composed of a part of an ellipse. It means that the deeper the position the smaller the diameter becomes in the concave portion 5. By forming the concave portion 5 in such a shape, the solder portion 3 can be formed to protrude toward the direction of the base member to have the summit portion 3a. By forming the solder portion 3 to have such a shape, the differences in the distance between each of the leads 112 and a board can easily be compensated.

Further, although not shown in the drawings, for the example when the depth of the bottom portion 5b is relatively deep, a connecting hole which is open on the back side of the pallet 4 may be provided at the bottom portion 5b.

The pallet 4 may be composed of a material whose wettability is lower than that of the surface layer 62 of the lead 112 such as glass epoxy (FR4), stainless, ceramics or the like. Further, as shown in FIG. 11, the housing 6 of the connector C includes two dowel pins 6a for positioning when the connector C is mounted on the board. The pallet 4 includes two dowel pin holes 4a corresponding to the dowel pins 6a in addition to the concave portions 5 aligned in a matrix.

The method of manufacturing the connector C that includes plural lead units 110 each including the lead 112 to which the diffusion prevention portion that prevents diffusion of solder toward the middle part of the lead 112, includes introducing soldering paste in plural concave portions 5 aligned to correspond to the connecting surfaces 2ba of the plural leads 112 in a pallet 4, placing the connector C on the pallet 4 so that the connecting surface 2ba of each of the leads 112 contacts or is inserted into the soldering paste in the concave portion 5, and heating the soldering paste. When introducing the soldering paste in the plural concave portions 5 of the pallet 4, the soldering paste may be introduced by a squeegee or the like, for example.

The heating of the soldering paste may be performed before placing the connector C on the pallet 4, or may be performed after placing the connector C on the pallet 4.

Hereinafter, an example where the heating of the soldering paste is performed after placing the connector C on the pallet 4 will be assumed. For example, when forming the solder portion 3 including a large amount of the soldering paste, this process may be used.

Although not shown in the drawings, a heater for heating the soldering paste such as a hotplate or the like is provided at the back side of the pallet 4.

When forming the solder portions 3, soldering paste 7 is introduced in the concave portions 5 of the pallet 4 by a squeegee. Then, as shown in FIG. 11, the connector C is placed on the pallet 4 by having the dowel pins 6a of the housing 6 insert into the respective dowel pin holes 4a. At this time, the soldering paste 7 is heated by the heater, not shown in the drawings.

Figure 12:
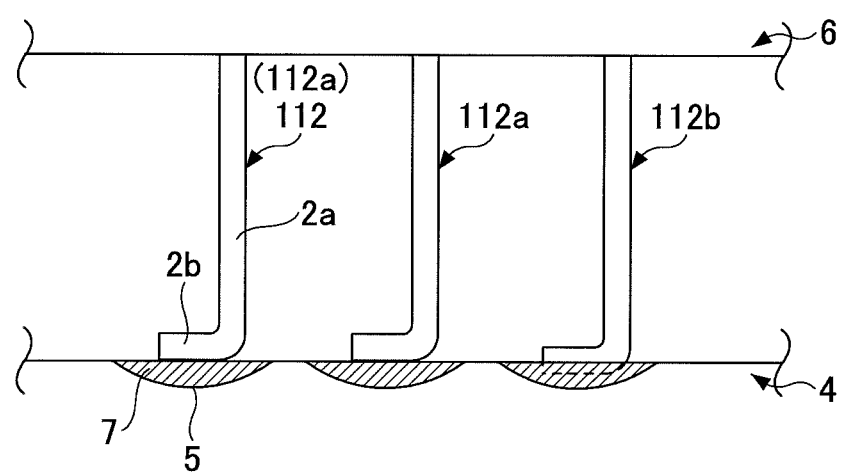
FIG. 12 is a cross-sectional view taken along an X-X line of FIG. 11.

FIG. 12 is a cross-sectional view taken along an X-X line of FIG. 11.

As shown in FIG. 12, the foot 2b of the lead 112 contacts or is inserted into the soldering paste 7 in the concave portion 5 of the pallet 4 in accordance with its protruding amount. Hereinafter, for explanatory purposes, different numerals such as 112a, 112b or the like are used to denote the leads. The connector C may be positioned on the pallet 4 so that the lead 112a whose protruding amount is the shortest, contacts the soldering paste 7 in the concave portion 5 of the pallet 4 while the lead 112b whose protruding amount is longer than that of the lead 112b is inserted into the soldering paste 7 in the concave portion 5 of the pallet 4.

Figure 13A:
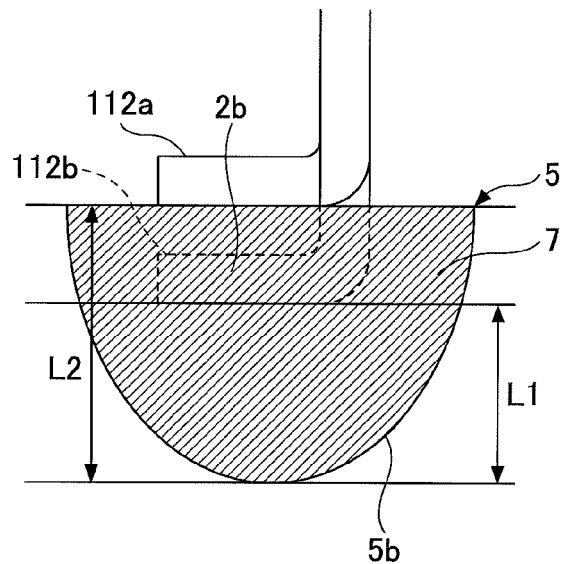
FIG. 13A is an explanatory view showing the leads having different protruding amounts.

FIG. 13A is an explanatory view showing the leads 112a and 112b having different protruding amounts contact or are inserted into the soldering paste 7 in the concave portion 5. Here, for the lead 112a whose protruding amount is shorter (hereinafter simply referred to as a shorter lead 112a as well), the foot 2b contacts the surface of the soldering paste 7. Meanwhile, regarding the lead 112b whose protruding amount is longer (hereinafter simply referred to as a longer lead 112b as well), the foot 2b is inserted into the soldering paste 7 in the concave portion 5.

Therefore, the length L1 between the bottom of the longer lead 112b and the bottom of the bottom portion 5b is shorter than the length L2 between the bottom of the shorter lead 112a and the bottom of the bottom portion 5b.

When a predetermined period has passed and the soldering paste 7 is cooled, because of a surface tension effect due to the fact that the wettability of the concave portion 5 is lower than that of the connecting surface 2ba of the foot 2b of the lead 112a or 112b, the solder portion 3 is formed at the foot 2b.

Figure 13B:
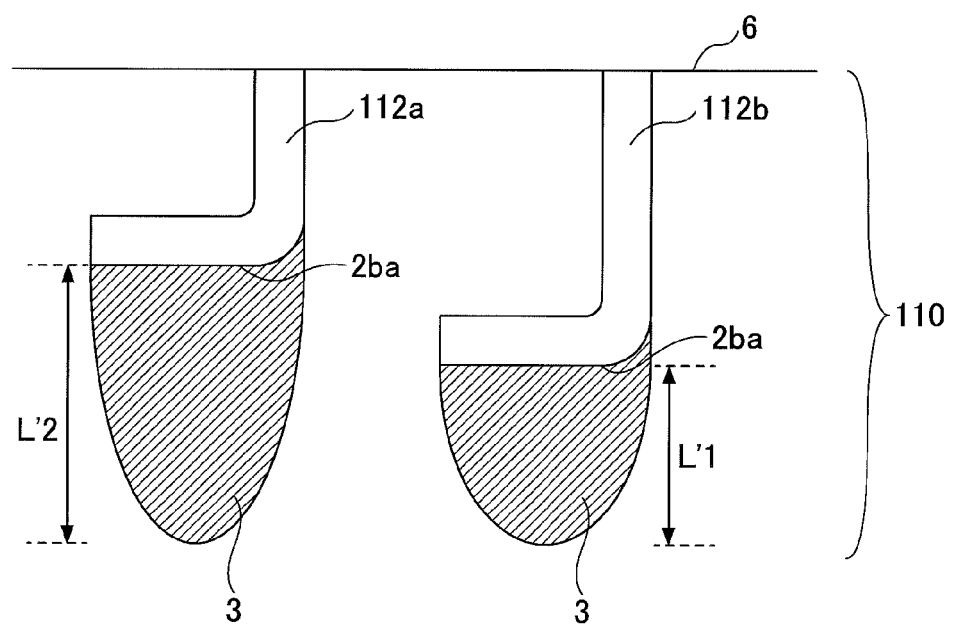
FIG. 13B is an explanatory view showing the leads having different protruding amounts.

At this time, the solder portion 3 having a longer length from the connecting surface 2ba for the shorter lead 112a is formed while the solder portion 3 having a shorter length from the connecting surface 2ba for the longer lead 112b is formed. Therefore, as shown in FIG. 13B, the shorter lead 112a has the solder portion 3 whose length from the connecting surface 2ba is L'2 and the longer lead 112b has the solder portion 3 whose length from the connecting surface 2ba is L'1 where L'1 is shorter than L'2.

Figure 13C:
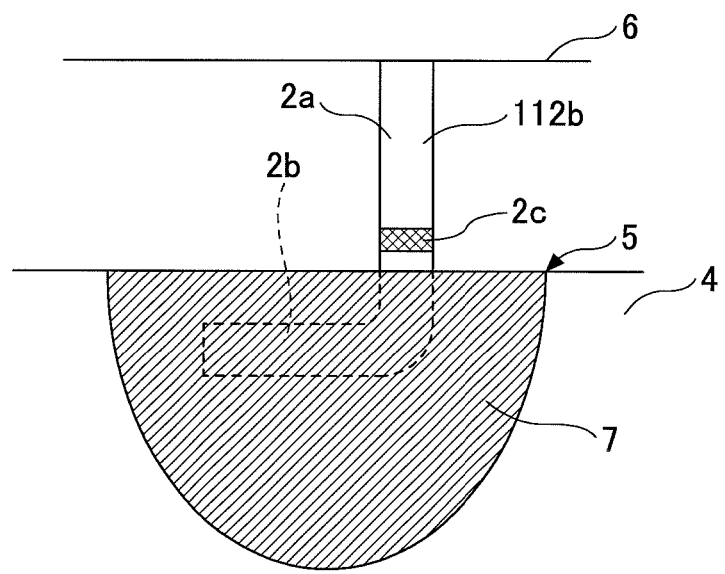
FIG. 13C is an explanatory view showing the lead inserted into the soldering paste.

According to the present embodiment, as the solder dam 2c whose wettability is low is formed at the body portion 2a of the lead 112, even when the lead 112b is inserted into the heated and melted soldering paste 7, the solder does not spread over the solder dam 2c and onto the body portion 2a of the lead 112b as shown in FIG. 13C. The position and the shape of the solder dam 2c may be set based on the differences of the length of the leads that may cause for the leads of a target product (the connector C, for example).

Next, a method of mounting the connector C on the board is explained.

FIG. 14A is a cross-sectional view showing an example of the connector C and a board B before reflowing. FIG. 14B is a cross-sectional view showing the example of the connector C and the board B after reflowing. Although not shown in FIG. 14A and FIG. 14B, the solder dams 2c are formed on the leads 112, respectively.

The board B includes pads P respectively provided with soldering paste S. As shown in FIG. 14B, the foot 2b of each of the leads 112 is electrically connected to each of the pads P of the board B. The soldering paste S of the board B may be formed by printing or the like. Further, the soldering paste S of the board B may be composed of the same material as that of the soldering paste 7 used for the connector C. The material for the soldering paste may be Sn—Bi alloy, Sn—In alloy, Sn—Ag—Cu alloy or the like having a melting point capable of being melted when heated by the heater, not shown in the drawings. By using the same material for the solder portion 3 (the soldering paste 7) of the connector C as that of the soldering paste S, the connection between the lead 112 and the pad P can be strengthened after it is connected. However, the material for the solder portion 3 of the connector C may be different from that of the soldering paste S.

According to the present embodiment, as shown in FIG. 13B, by forming the solder portions 3 to the leads 112 before mounting the connector C on the board B, the variation in the protruding amount of the lead units 110 can be reduced as the shorter the protruding amount of the lead 112 is the longer the solder portions 3 becomes.

When the connector C is placed on the board B, as shown in FIG. 14A, the solder portion 3 of the lead unit 110 whose protruding amount is the longest (in this case the lead unit 110d), contacts the soldering paste S of the board B. The solder portion 3 of the lead unit 110 may be inserted into a part of the soldering paste S of the board B when the hardness of the solder portion 3 is equal to or more than that of the soldering paste S.

The solder portion 3 may be formed so that the distance W2 between the bottom of the lead unit 110c whose protruding amount is the shortest (hereinafter simply referred to as the shortest lead unit 110c as well) and the upper surface of the soldering paste S of the board B becomes shorter than the length W1 of the solder portion 3 of the shortest lead unit 110c. With this structure, the lead 112c of the shortest lead unit 110c can contact with the corresponding pad P of the board B after reflowing the solder.

Further, the solder portion 3 may be formed so that the distance W2 between the bottom of the shortest lead unit 110c and the upper surface of the soldering paste S of the board B becomes shorter than the length W5 between the bottom of the lead 112d whose protruding amount is the longest (hereinafter simply referred to as the longest lead 112d as well) and the upper surface of the pad P of the board B. In other words, the length of the solder portion 3 may be longer than the difference between the length of the longest lead 112d and the shortest lead 112c. With this structure, when the solder of the solder portion 3 and the soldering paste S melts by reflowing, the connector C moves downward until the connecting surface 2ba of the longest lead 112d contacts the pad P of the board B as shown in FIG. 14B, the shortest lead 112c is also electrically connected with the pad P via the solder composed of the solder portion 3 and the soldering paste S. Therefore, a good connection of the leads 112 to the board B can be obtained.

After placing the connector C on the board B, by reflowing of the solder, the solder portions 3 and the soldering paste S between the leads 112 of the connector C and the pads P of the board B are melted by heat and the solder portions 3 moves downward by gravity toward the soldering paste S to be connected with the soldering paste S. At this time, as the solder dam 2c is formed on each of the leads 112 (see FIG. 2 for example), the solder is blocked by the solder dam 2c and does not spread over solder dam 2c onto the upper part of the body portion 2a of the lead 112. Therefore, the solder tends to move downward to connect with the soldering paste S of the board B.

Then, after cooling for a predetermined period, the leads 112 and the pads P of the board B are electrically connected via the solder composed of the solder portions 3 and the soldering paste S, respectively.

According to the embodiment, the connecting surface 2ba of the longest lead 112d contacts the pad P of the board B after reflowing.

In an alternative example, the distance between leads 112 of the connector C and the pads P of the board B after reflowing may be adjusted.

FIG. 15A and FIG. 15B show cross-sectional views showing another example of the connector C and the board B. In this example, the housing 6 of the connector C includes a spacer portion 6b formed to surround the peripheral of the leads 112 aligned in a matrix. The spacer portion 6b defines the position of the leads 112 with respect to the board B by contacting the board B when mounting the connector C on the board B.

By providing the spacer portion 6b to the housing 6 of the connector C, even when the solder portion 3 and soldering paste S between the leads 112 and the pads P melt by reflowing, the relative position of the housing 6 with respect to the board B can be regulated by the spacer portion 6b. As shown in FIG. 15B, the height H of the spacer portion 6b in the vertical direction may be set so that there is a space W6 between the longest lead 112d and the respective pad P when the spacer portion 6b is placed and contacted on the board B. Alternatively, the height H of the spacer portion 6b in the vertical direction may be set so that there is no space W6 to have the longest lead 112d contact the respective pad P when the spacer portion 6b is placed and contacted on the board B.

Further, as shown in FIG. 15A, the distance W3 between the spacer portion 6b and the board B before reflowing may be shorter than the distance W4 between the longest lead 112d and the respective pad P. By such a structure, there exists a space between the longest lead 112d and the respective pad P as shown in FIG. 15B to have the solder provided between all of the leads 112 and the respective pads P when the housing 6 is moved downward to contact the board B as shown in FIG. 15B. Further, by forming the housing 6 composing the spacer portion 6b by an insulator, it is easier to control the size of the insulator than to control the size or the shape of the leads 112, so the control of the positioning can be performed easily.

In FIG. 14A to FIG. 15B, the parts are just typically shown and are not express actual length or size.

Figure 5A:
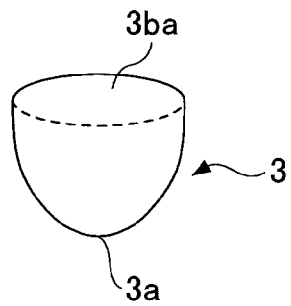
FIG. 5A is a perspective view showing another example of the solder portion.
Figure 5B:
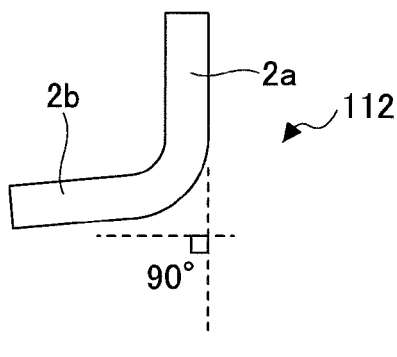
FIG. 5B and FIG. 5C are perspective views showing another example of the lead.
Figure 5C:
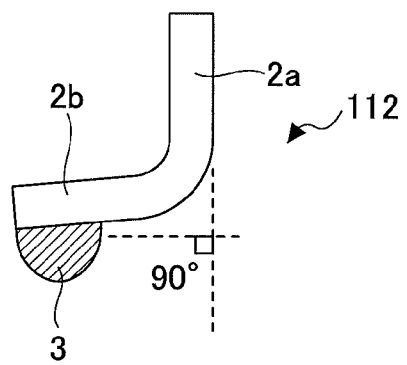

Next, another example of the solder portion 3 is explained. FIG. 5A is a perspective view showing another example of the solder portion 3. FIG. 5B and FIG. 5C are perspective views showing another example of the lead 112.

When the amount of the soldering paste composing the solder portion 3 is small, the shape of the solder portion 3 becomes hemispherical as shown in FIG. 5A. The shape of the solder portion 3 may be a part of an ellipse where the ellipse is cut in the direction perpendicular to the major axis of the ellipse. The summit portion 3a is formed at the bottom of the solder portion 3.

In this example, the solder portion 3 may be formed near the end (first end of the lead 112) of the foot 2b of the lead 112 so that the summit portion 3a of the solder portion 3 may be positioned at the end of the foot 2b of the lead 112. In this case, the lead 112 may be bent so that the angle between the foot 2b and the body portion 2a becomes greater than 90 degree. With such a structure, the foot 2b of the lead is inclined with respect to the horizontal direction such that its end portion is lower than its connecting portion with the body portion 2a and when the soldering paste is attached to the foot 2b of the lead 112, the soldering paste moves toward the end because of the gravity. As a result, the solder portion 3 is formed at the end of the foot 2b of the lead 112 as shown in FIG. 5C.

Figure 5D:
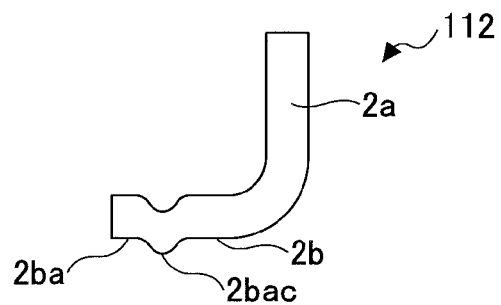
FIG. 5D is a perspective view showing another example of the lead.

Alternatively, as shown in FIG. 5D, the lead 112 may include a protruding portion 2bac protruding downward from the connecting surface 2ba and provided at the foot 2b near its end. The protruding portion 2bac may be formed by a bending process. With the protruding portion 2bac, the melted and attached soldering paste can be moved toward the protruding portion 2bac by a surface tension effect. Alternatively, the protruding portion 2bac may be formed by a press working.

By the function of the angle of the foot 2b with respect to the body portion 2a or the protruding portion 2bac as described above, the position of the solder portion 3 (in other words the position of the summit portion 3a) can be determined to be near the end of the foot 2b of the lead 112.

Next, alternative examples of the solder dam 2c are explained.

The position and the shape of the solder dam 2c may be designed in accordance with a target amount of the soldering paste composing the solder portion 3.

Figure 6A:
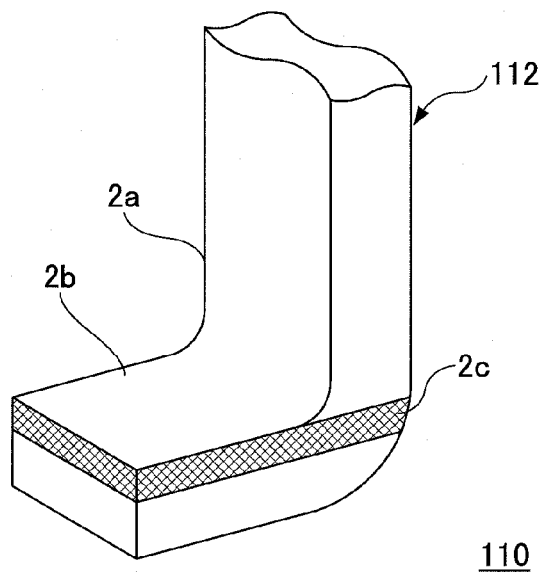
FIG. 6A and FIG. 6B are perspective views showing another example of the first end of the lead.
Figure 6B:
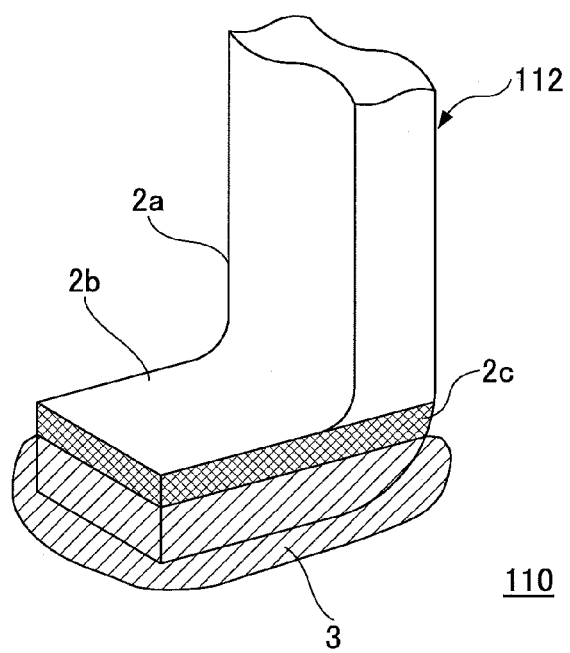

FIG. 6A and FIG. 6B are perspective views showing another example of the first end of the lead 112.

In this example, the solder dam 2c is formed at the upper part of the side surface of the foot 2b. In this example as well, the solder dam 2c is cylindrically formed in the horizontal direction to separate the lower part of the foot 2b and the body portion 2a of the lead 112 in its extended direction (in the vertical direction). By this structure, even when the lead 112 is inserted into the concave portion 5, the soldering paste is not formed on the solder dam 2c. As a result, the lead unit 110 in which the solder portion 3 is formed at the bottom surface (the connecting surface 2ba) and the lower part of the side surface of the foot 2b, as shown in FIG. 6B, can be obtained.

Figure 7A:
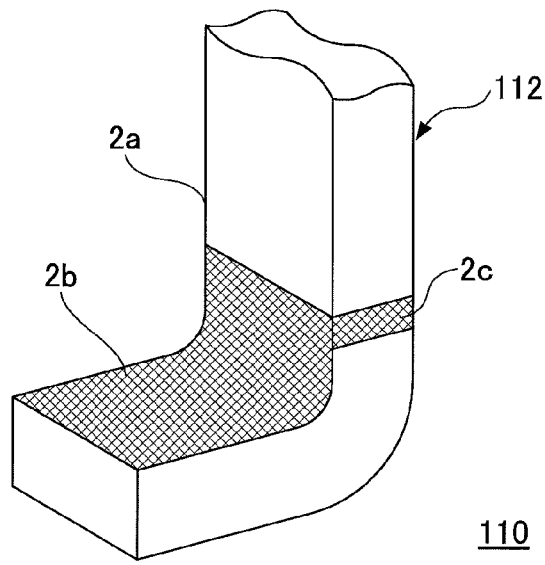
FIG. 7A and FIG. 7B are perspective views showing another example of the first end of the lead.
Figure 7B:
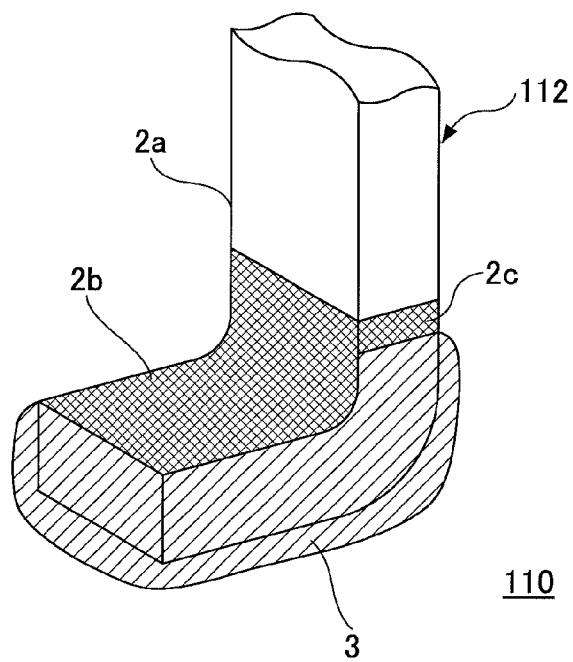

FIG. 7A and FIG. 7B are perspective views showing another example of the first end of the lead 112.

In this example, the solder dam 2c is cylindrically formed below the body portion 2a in the horizontal direction to separate the body portion 2a of the lead 112 in its extended direction (in the vertical direction) similarly to that shown in FIG. 2 and is also formed on the upper surface, an opposing surface of the connecting surface 2ba of the foot 2b. By this structure, even when the lead 112 is inserted into the concave portion 5, the soldering paste is not formed on the solder dam 2c. As a result, the lead unit 110 in which the solder portion 3 is formed at the bottom surface (the connecting surface 2ba) and the side surface of the foot 2b, as shown in FIG. 7B, can be obtained.

Figure 8:
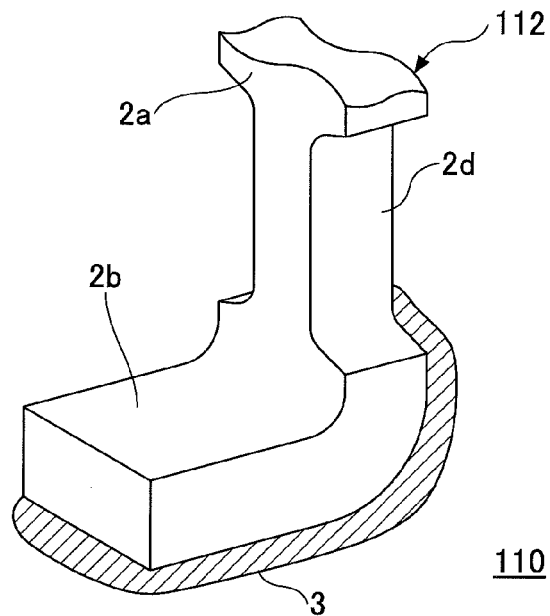
FIG. 8 is a perspective view showing another example of the first end of the lead.

FIG. 8 is a perspective view showing another example of the first end of the lead 112.

Instead of forming the solder dam 2c, the lead 112 may include a narrow portion 2d where the width of the lead 112 is narrower than those of other parts, as the diffusion prevention portion. The narrow portion 2d may be formed at the body portion 2a of the lead 112. With this structure, laser irradiation is not necessary and therefore time and cost of the process can be reduced.

Further, instead of reducing the width of the lead 112 at the narrow portion 2d, the thickness of the lead 112 may be made thinner than those of the other parts at the narrow portion 2d.

Figure 9:
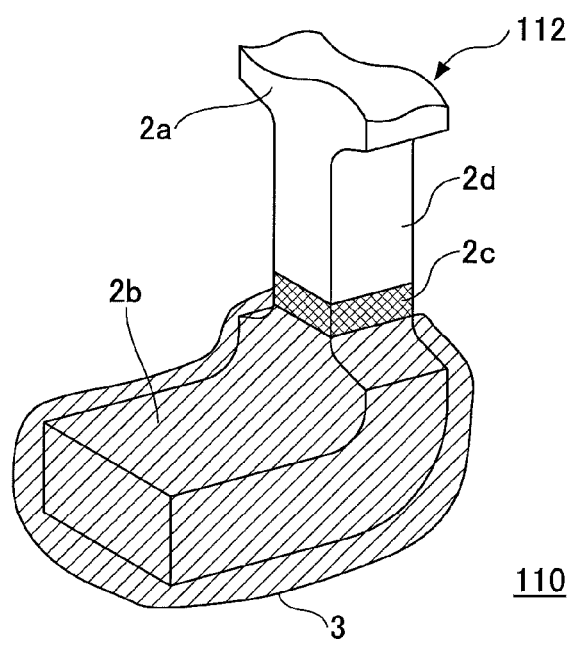
FIG. 9 is a perspective view showing another example of the first end of the lead.

Further, as shown in FIG. 9, the lead unit 110 may include the solder dam 2c and the narrow portion 2d at the same time, as the diffusion prevention portion.

Another method of mounting the connector C on the board will now be explained. Hereinafter, an example where the heating of the soldering paste is performed before placing the connector C on the pallet 4 is explained. For example, when forming the solder portion 3 to include a relatively small amount of the soldering paste, this process may be used.

Referring to FIG. 10, the soldering paste of a relatively small amount is introduced in the concave portions 5 of the pallet 4 by the squeegee. In this example, the depth of the concave portions 5 may be set shallower so that the amount of the soldering paste attached to the leads 112 becomes less. Then, referring to FIG. 11, before placing the connector C on the pallet 4, the soldering paste in the concave portions 5 of the pallet 4 is heated by the hotplate, not shown in the drawings, provided at the back side of the pallet 4. The heated soldering paste expands to protrude from the surface of the pallet 4.

Then, the connector C is placed on the pallet 4 as shown in FIG. 11 under this condition.

In this example, the lead 112 having the structure as shown in FIG. 5B or FIG. 5D may be used. As for this example, when placing the connector C on the pallet 4, the end of the foot 2b or the protruding portion 2bac of the foot 2b contacts the soldering paste in the concave portion 5 or protruding from the concave portion 5. Then, the melted soldering paste moves toward the end by either gravity or the surface tension effect.

According to the connector C and the method of forming the connector C of the embodiment, the following merits can be obtained.

As the solder portions 3 having predetermined heights respectively are already provided to the leads 112 before mounting the connector C to the board B, even when the board B is warped and the distances between the leads 112 and the board B are varied for each of the leads 112 or even when there is a variation of the length of the leads 112, the solder portions 3 melt at reflowing to compensate for the differences in the distance so that all of the leads 112 can be electrically connected with the respective pads P.

Therefore, the management of having the length of the leads 112 of the connector C uniform, so-called coplanarity, is not necessarily performed as strictly so that cost can be lowered. Further, failure in connections between the leads 112 with the board B via the solder mainly caused by the warp of the board B or variation in the length of leads 112 can be prevented.

Further, as described above, when reflowing is performed to electrically connect the leads 112 with the pads P, the solder portions 3 melt so that the leads 112 having longer lengths freely move toward the board B while the leads 112 having shorter lengths can be electrically connected via solders of the solder portion 3 and the soldering paste S to compensate for the difference in length of the leads 112. Therefore, the leads 112 of the connector C can be connected with pads P of the board B with a high reliability without strictly controlling the warp of the board B, or the heights of the pads P of the board B facing the leads 112. Further, the leads 112 of the connector C can be connected with pads P of the board B with a high reliability without strictly controlling the length of the leads 112 to be uniform.

Further, by previously providing the diffusion prevention portion such as the solder dam 2c, the narrow portion 2d or the like to the lead 112, diffusion of the solder composing the solder portion 3 toward the body portion 2a of the lead 112 can be prevented by the diffusion prevention portion. Therefore, the amount of the soldering paste composing the solder portion 3 can be controlled by the amount of the soldering paste introduced in the concave portions 5 of the pallet 4. Therefore, the amount can be controlled by the depth of the concave portions 5 of the pallet 4, for example.

Further, by providing the cylindrical diffusion prevention portion extending in a direction substantially perpendicular to the extended direction of the body portion 2a, the upper position of the solder portions 3 formed on the lead 112 can be easily controlled.

Further, by composing the bottom portions 5b of the concave portions 5 of the pallet 4 for forming the solder portions 3 with a material of a low wettability in an elliptical shape, the solder portions 3 can be easily removed from the concave portions 5. Therefore, the connector C can be easily removed from the pallet 4.

Further, by using the leads 112 as shown in FIG. 4C, FIG. 4D, FIG. 5B, FIG. 5D or the like, the position of the solder portion 3 can be easily defined so that the summit portion 3a can be placed at a predetermined position when mounting the connector C on the board B. By this, the electrical connection between the leads 112 and the board B can be surely obtained.

When the depth of the concave portions 5 are deep to a certain extent, there may be provided a through hole that is open to the back side of the pallet 4 in the bottom of each of the concave portions 5. In such a case, by evacuating the concave portions 5 from the back side of the pallet 4, bubbles generated in soldering pastes in the concave portions 5 can be removed. Further, instead of providing the through holes, a porous means may be provided so that air can move between the bottom portion 5b and the back side of the pallet 4.

Further, according to the embodiment, the soldering paste is heated by the hotplate, not shown in the drawings, provided at the back side of the pallet 4 when forming the solder portions 3, therefore, the connector C, which is a surface mount device, is not directly heated. With this structure, the damage to the connector C by the heat can be prevented and the performance of the connector C can be highly maintained.

Further, alternatively, instead of using the hotplate, other kinds of heaters such as a reflow furnace may be used when forming the solder portions 3.

The surface mount device of the embodiment may be adapted to any devices which are to be mounted on a board or the like, not limited to the connector C as described above, and may be adapted to other devices such as an IC, a chip component or the like.

According to the embodiment, the surface mount device which can form a good connection with a base member such as a board or the like can be provided even when the base member warps or there is a variation in the length of the leads. Further, the present embodiment can be adapted to an electronic device and method of manufacturing the electronic device for a house, for an office, for an industrial use or the like used for a computer, a personal computer, a workstation or the like.

According to the surface mount device or the method of manufacturing the surface mount device, even when the board warps when mounting the surface mount device on the board, the lead can be connected to the pad of the board to ease the management for having the length of the leads 112 of the connector C uniform (so-called coplanarity). Concretely, when connecting the lead with the pad of the board by reflowing, as the solder portion 3 is melted so that the surface mount device can move toward the board with respect to the board so that even when differences exist in the distance between the lead and the pad because of the variation in length of the lead or the warp of the board, the connection can be formed with a high reliability. Further, the leads 112 of the connector C can be connected with pads P of the board B with a high reliability without strictly controlling the length of the leads 112 to be uniform.

The present invention is not limited to the specifically disclosed embodiments, and variations and modifications may be made without departing from the scope of the present invention.

The present application is based on Japanese Priority Application No. 2011-18488 filed on Jan. 31, 2011, the entire contents of which are hereby incorporated herein by reference.

What is claimed is:

1. A surface mount device to be mounted on a base member, comprising:
   a plurality of leads each including
      a body portion extending in a first direction, and
      a foot bent from a first end of the body portion to be positioned at an end of the lead and provided with a flat surface that faces toward the base member,
   the lead being formed by
      a conductive portion formed at a center,
      a surface layer formed at a surface, and
      a base layer formed between the conductive portion and the surface layer and composed of a material whose wettability is lower than that of the surface layer;
   a plurality of protruding portions each formed at the flat surface of the foot of each of the leads by an inclined surface inclined with respect to the respective flat surface; and
   a plurality of solder portions each formed at the foot of each of the leads to protrude toward the direction of the base member to have a summit portion,
   wherein each of the protruding portions protrudes from the respective flat surface toward the direction of the base member and defines the position of the solder portion so that the solder portion is formed on the protruding portion before mounting the surface mount device on the base member, and
   wherein each of the leads is provided with a narrow portion at the body portion where the width or the depth of the conductive portion is narrower or thinner than a first end portion at the first end of the body portion for preventing a diffusion of a solder along the body portion of the lead.

2. The surface mount device according to claim 1, further comprising:
   a housing that houses the leads such that a part of the body portion and the foot of each of the leads protrude from the housing and including a spacer portion for defining the position of the leads with respect to the base member when the surface mount device is mounted on the base member.

3. The surface mount device according to claim 1, wherein a solder dam whose wettability is lower than the other part of the lead is provided at the narrow portion of each of the leads.

4. The surface mount device according to claim 3, wherein the solder dam is formed by removing a part of the surface layer.

5. The surface mount device according to claim 1, wherein the narrow portion is cylindrically formed so that the width and the depth of the conductive portion is narrower and thinner than the first end portion.

6. The surface mount device according to claim 1, wherein in each of the leads, the surface layer and the base layer cover the entirety of the conductive portion.

7. The surface mount device according to claim 1, wherein in each of the leads, the narrow portion is only provided in the vicinity of the first end portion so that the width or the depth of the conductive portion at another portion at a second end side, which is opposite from the first end, is broader or thicker than the narrow portion.

8. The surface mount device according to claim 1, wherein the conductive portion is composed of a material including copper, the surface layer is composed of a gold plating material, and the base layer is composed of a material including Ni.

\* \* \* \* \*